June 11, 1968 C. L. WARD, JR., ETAL 3,387,648

CABINET ENCLOSED RECIRCULATION COOLING SYSTEM CARRIED ON EXTENSIBLE CHASSIS MOUNTING ELECTRONIC MODULES

Filed Feb. 23, 1967

INVENTORS
CLYDE L. WARD, JR.
ARTHUR A. ARNOLD
BY
ATTORNEYS

United States Patent Office 3,387,648
Patented June 11, 1968

3,387,648

CABINET ENCLOSED RECIRCULATION COOLING SYSTEM CARRIED ON EXTENSIBLE CHASSIS MOUNTING ELECTRONIC MODULES

Clyde L. Ward, Jr., La Mesa, and Arthur A. Arnold, San Diego, Calif., assignors to the United States of America as represented by the Secretary of the Navy
Filed Feb. 23, 1967, Ser. No. 619,126
6 Claims. (Cl. 165—47)

ABSTRACT OF THE DISCLOSURE

The present invention relates to a cabinet enclosed cooling system. A cabinet of heavy duty integral or a prefabricated construction encloses an extensible drawer having several transversely extending racks which support any number of electronic modules. Due to the highly sophisticated nature of the electronic circuitry contained within the electronic modules, precise temperature and humidity control within the cabinet is maintained by providing a cooling unit mounted on an extensible drawer connected to a system of ducts included in the extensible chassis and transversely extending rack sections. Thus, cool, humidity-controlled air may be directed to the electronic modules to insure the proper ambient conditions for optimum operation. The present invention provides such ambient control whether or not the drawer-chassis is within the cabinet or extended to the cabinet exterior while being inspected or repaired.

The invention described herein may be manufactured and used by or for the Government of the United States of America for governmental purposes without the payment of any royalties thereon or therefor.

*Background of the invention*

The present invention pertains to methods and systems for maintaining precisely controlled temperature and humidity within a cabinet. With most known systems an external source of air is constantly being brought into the cabinet from a blower cooling unit and directed through the cabinet past the electronic modules. The obvious disadvantage of such a system is that the air brought into the cabinet may be polluted with a resulant adverse effect to the electronic modules. Other known techniques utilize an elaborate system of ducts and conduits which supplement the supporting structure of the cabinet resulting in an unnecessary duplication of cabinet structure and a consequent loss of space within which electronic modules could be mounted. A cooling system presently in wide use places the cooling unit within the cabinet with a flexible bellows-hose leaning from the cooling unit to the electronic modules. Here again, storage space is wasted due to the space taken by the bellows hose. In addition, such flexible hoses fatigue after prolonged use and develop leaks and are, therefore, unreliable. Popular recirculating fluid cooling systems are complicated, weigh too much, and include the other attendant disadvantages of a fluid cooling system.

It is a prime object of the invention to provide an electronic modules storing cabinet having an interior controlled as to temperature and humidity.

A further object is to provide a cabinet having an extensible drawer chassis which carries the cooling unit to eliminate excess ducts.

Another object of the invention is to provide a system for cooling electronic modules which regulates module temperature and humidity when the drawer chassis is inside or outside of the cabinet.

Still another object of the invention is to provide a cooling system which recirculates the same air.

An additional object of the invention is to provide a cooling system in which the module supporting racks form the outlet and inlet ducts for the cooled air.

The specific nature of the invention as well as other object uses and advantages thereof will clearly appear from the ensuing description and the accompanying drawings in which.

*Summary of the invention*

Figures 1, 2, 3:
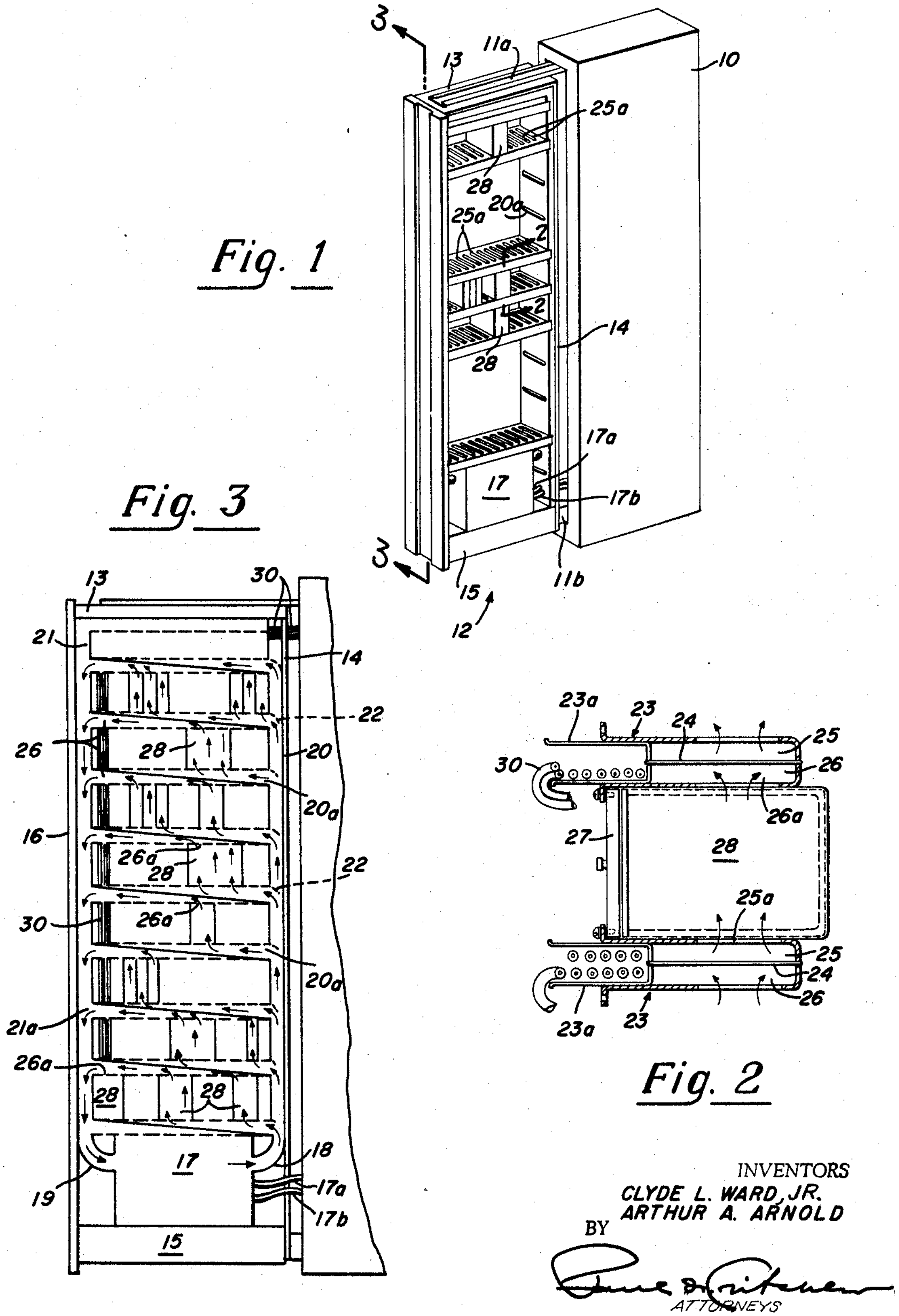
FIG. 1 shows a perspective view of the cabinet with the drawer chassis extended and a number of electronic modules mounted thereon.
FIG. 2 is a sectional view of a module support rack taken along lines 2—2 in FIG. 1.
FIG. 3 is a sectional view taken along lines 3—3 in FIG. 1 showing recirculating air flow.

The invention is directed to providing a self-contained cooling system for cooling electronic modules mounted on a module chassis. The chassis is extensible from the cabinet to permit repair or inspection of the modules or repair and inspection of the cooling unit mounted on the chassis. Conduits extending from the cooling unit and returning to the cooling unit recirculate temperature and humidity controlled air over the electronic modules when the chassis is inside or outside of the cabinet. The conduits and ducts, while providing passageways for the cooled air, additionally serve as module support racks.

*Description of the preferred embodiment*

Referring now to the drawings, a cabinet shell 10 is provided with an extensible drawer-chassis 12 supported from the cabinet by a pair of drawer chassis supports **11*a* and 11*b*. If an exceptionally rugged drawer-chassis is desired, a substantially rectangular framework consisting of the members 13, 14, 15, 16 as provided with the latter portion forming the outer door section. A cooling unit 17 for controlling humidity and temperature in the cabinet is disposed on member 15 and is provided with an air egress vent 18 and air return vent 19. The cooling unit, being of conventional type employing a fan blowing over coils, is additionally provided with a pair of coolant transfer hoses 17*a* and 17*b*. A hollow, vertically extending air egress conduit 20 being of substantially rectangular cross section is disposed along the inward side of the extensible drawer chassis and is connected to the air egress vent. An inner wall of air egress conduit 20 is formed with plurality of deflector plates 22, each plate extending further into the egress conduit in direct proportion to the distance from the cooling unit, the reasons for which will be stated below. A plurality of air egress slots 20*a* are disposed on the inner wall of the egress conduit in a substantially side by side relationship. Parallel to the egress conduit and adjacent the member 12 a hollow, vertically extending air return conduit 21 is connected to the air return vent. The return conduit similarly is provided with a plurality of air return slots 21*a*** placed in a side by side relationship and having individual ones of the return slots substantially opposed to individual ones of the outlet slots.

Mounted between the egress conduit and the return conduit a plurality of modules support racks 23 are positioned to enclose opposed pairs of slots. Each module support rack is essentially a hollow elongate tube of rectangular cross section. Each rack is divided by a separator 24 into an outlet duct 25 having a plurality of juxtaposed air outlet jets **25*a* and an inlet duct 26 having a plurality of juxtaposed air intake slots 26*a*. Individual racks are additionally formed with a longitudinally extending U-shaped channel 23*a* that is used as a wiring trough for conductors 30 which extend from the electronic modules to the cabinet interior. Receptacle forms 27** are mounted between adjacent ones of the module support racks and provide a means for fastening the modules onto the drawer chassis.

The separator 24 is positioned to uniformly decrease the cross-sectional area of the outlet duct to create a uniform air flow through the air outlet jets and to make possible a uniform vacuum in the inlet duct. Therefore, between adjacent module support racks, a uniform transfer of cooled air over modules enclosed in open-ended, rectangular cans will result by reason of the uniform, pressurized air flow through air outlet jets and the uniform vacuum at the intake slots. This uniformity of flow insured by the critical location of the separator 24 insures an identical, constant, controllable flow of cooling air around all the modules mounted on each rack.

As a novel feature of the invention, the conduits and interconnecting support racks could form the drawer-chassis but where a more rugged cabinet is needed, elements 13, 14, 15 and 16 are included.

The modules 28, approximately $\frac{8}{10}$ of an inch in width, are a packaged functional assembly of wired electronic components, and are mounted between opposed outlet jets and intake slots individually or, if electronic shielding is required the assemblies are enclosed in lightweight, open-ended metal cans.

Turning now to FIG. 3 the cooling unit 17 creates pressurized forced air in the air egress vent 18 and a vacuum in the air return vent 19. The pressurized forced air is directed upward in the egress conduit 19 deflected therefrom by deflector plates 22 into the module suppport racks. The size and shape of the deflector plates are such as to provide a uniform volume of air to each one of the air outlet ducts. The pressurized forced air delivered to each of the outlet ducts is passed between and around modules mounted in open-ended cans between adjacent support racks. The forced air, now heated from the modules is drawn into the inlet ducts and back to the cooling unit via return conduit 21 and return vent 19. This same air is again cooled and recirculated as before.

It should be pointed out that if the drawer chassiss is withdrawn from the cabinet, the same recirculation occurs with only a slight or negligible transfer to the surrounding air. The advantage of such a system, is that the possibility of contamination of the electronic modules from surrounding contaminated air is virtually eliminated.

Additionally, since precise temperature and humidity control is critical in certain sophisticated electronic networks, the constant operation of the cooling unit itself becomes critical. Such operation is optimized by mounting the cooling unit on the extensible drawer chassis to permit easy inspection and repair. Furthermore, having the cooling unit mounted in the drawer chassis eliminates the bulky, cabinet space occupying, bellows-type flexible hoses used with cabinet mounted cooling units, which hoses are prone to failure after continued use.

Obviously many modifications and variations of the present invention are possible in the light of the above teachings. It is therefore to be understood that within the scope of the appended claims the invention may be practiced otherwise than as specifically described.

What is claimed is:

1. A cabinet for housing electronic modules in a thermally controlled interior comprising:
- a cabinet shell;
- a drawer-chassis extensible from said cabinet shell including,
- a vertically extending air egress conduit provided with a plurality of air outlet slots; and
- a vertically extending air return conduit provided with a plurality of air return slots;
- a recirculating, cooling unit mounted on the extensible drawer-chassis and having an egress vent directly coupled to said egress conduit and a return vent directly coupled to said return conduit for permitting a constant supply of air over said module while inside and outside of said cabinet shell; and
- a plurality of module support racks extending between said egress and return conduit each including;
- an outlet duct communicating with one of said air outlet slots and formed with a plurality of air outlet jets; and
- an inlet duct communicating with one of said air return slots and formed with a plurality of air intake slots facing a direction opposite side outlet jets.

2. A cabinet according to claim 1 in which:
- individual ones of said air outlet slots and said air return slots are substantially opposed; and
- said module support racks are parallelly, adjacently disposed and further include means for supporting electronic modules therebetween.

3. A cabinet according to claim 1 wherein:
- said recirculating, cooling unit includes means for producing humidity controlled, cooled air at said egress vent and a means for producing a vacuum at said return vent.

4. A cabinet according to claim 1 wherein:
- said air outlet jets on module support racks and said air intake slots on adjacent module support racks are disposed in an opposed relationship permitting a flow of said cooled air over the electronic modules mounted therebetween.

5. A cabinet according to claim 1 in which each of said module control racks further includes:
- a U-shaped member coextensive with said outlet duct and said inlet duct for providing a channel for electric conductors leading from the electronic modules.

6. A cabinet according to claim 5 further including:
- a means for maintaining a constant cool air flow through all the outlet jets provided in each outlet duct.

References Cited

UNITED STATES PATENTS

| | | | |
|---|---|---|---|
| 3,298,195 | 1/1967 | Raskhodoff | 165—47 X |
| 2,962,875 | 12/1960 | Barroero | 62—419 X |

ROBERT A. O'LEARY, *Primary Examiner.*

A. W. DAVIS, *Assistant Examiner.*